United States Patent
Mitsui

(10) Patent No.: US 8,652,306 B2
(45) Date of Patent: Feb. 18, 2014

(54) METHOD FOR MANUFACTURING MASK BLANK, METHOD FOR MANUFACTURING TRANSFER MASK, SPUTTERING TARGET FOR MANUFACTURING MASK BLANK

(75) Inventor: Masaru Mitsui, Tokyo (JP)

(73) Assignee: Hoya Corporation, Shinjuku-Ku (JP)

( * ) Notice: Subject to any disclaimer, the term of this patent is extended or adjusted under 35 U.S.C. 154(b) by 1825 days.

(21) Appl. No.: 10/523,470

(22) PCT Filed: Aug. 19, 2003

(86) PCT No.: PCT/JP03/10438
§ 371 (c)(1), (2), (4) Date: Mar. 10, 2005

(87) PCT Pub. No.: WO2004/017140
PCT Pub. Date: Feb. 26, 2004

(65) Prior Publication Data
US 2005/0250017 A1    Nov. 10, 2005

(30) Foreign Application Priority Data
Aug. 19, 2002   (JP) .................................. 2002-238564

(51) Int. Cl.
C23C 14/34   (2006.01)
(52) U.S. Cl.
USPC ............ 204/192.26; 204/192.27; 204/192.28; 204/298.12; 204/298.13; 204/192.23; 430/5
(58) Field of Classification Search
USPC ............... 430/5; 204/192.23, 192.26, 192.27, 204/192.28, 298.12, 298.13
See application file for complete search history.

(56) References Cited

U.S. PATENT DOCUMENTS

| | | | | |
|---|---|---|---|---|
| 4,750,932 A | * | 6/1988 | Parent et al. | 75/228 |
| 4,938,798 A | * | 7/1990 | Chiba et al. | 75/230 |
| 5,830,607 A | | 11/1998 | Isao et al. | |
| 5,919,321 A | | 7/1999 | Hirakawa | |
| 5,935,735 A | * | 8/1999 | Okubo et al. | 430/5 |
| 5,942,356 A | | 8/1999 | Mitsui et al. | |
| 6,087,047 A | * | 7/2000 | Mitsui et al. | 430/5 |
| 6,335,124 B1 | | 1/2002 | Mitsui et al. | |
| 2001/0007731 A1 | | 7/2001 | Inazuki et al. | |

FOREIGN PATENT DOCUMENTS

| | | |
|---|---|---|
| EP | 1 182 504 A2 | 2/2002 |
| JP | 06-332152 | 12/1994 |
| JP | 07-128840 | 5/1995 |

(Continued)

OTHER PUBLICATIONS

Machine Translation of Hiraka JP 10-110265 dated Apr. 1998.*

Primary Examiner — Rodney McDonald
(74) Attorney, Agent, or Firm — Oliff PLC

(57) ABSTRACT

To provide a method for manufacturing a mask blank capable of manufacturing a high quality mask blank that suppresses generation of defects in a thin film for forming a mask pattern with high yields, a method for manufacturing a transfer mask that manufactures the thin film of the mask blank by patterning, and a sputtering target used for manufacturing the mask blank. By using the sputtering target containing silicon and having a hardness of 900 HV or more in Vickers' hardness, the thin film for forming the mask pattern on a substrate is formed by sputtering, and the high quality mask blank that suppresses generating of defects is manufactured, and further the transfer mask is manufactured by patterning the thin film.

14 Claims, 3 Drawing Sheets

| DEFECT SIZE OF MASK BLANK SAMPLE | HARDNESS OF TARGET | | |
|---|---|---|---|
| | 870Hv | 980Hv | 1100Hv |
| | SAMPLE 1 | SAMPLE 2 | SAMPLE 3 |
| LESS THAN 0.3 μm | 0 SHEETS | 16 SHEETS | 52 SHEETS |
| NOT LESS THAN 0.3 μm AND LESS THAN 0.5 μm | 11 SHEETS | 21 SHEETS | 28 SHEETS |
| NOT LESS THAN 0.5 μm AND LESS THAN 1 μm | 18 SHEETS | 43 SHEETS | 12 SHEETS |
| NOT LESS THAN 1 μm | 71 SHEETS | 20 SHEETS | 8 SHEETS |

(56) References Cited

FOREIGN PATENT DOCUMENTS

| JP | A-08-283937 | | 10/1996 |
|----|----|----|----|
| JP | A 10-073913 | | 3/1998 |
| JP | 10-110265 | * | 4/1998 |
| JP | 10-148929 | | 6/1998 |
| JP | 2001-183805 | | 7/2001 |
| JP | 2001-303243 | | 10/2001 |
| JP | A-2001-303243 | | 10/2001 |
| JP | A-2002-062632 | | 2/2002 |
| JP | A-2002-090978 | | 3/2002 |
| JP | A-2002-182365 | | 6/2002 |

* cited by examiner

FIG. 1

| DEFECT SIZE OF MASK BLANK SAMPLE | HARDNESS OF TARGET | | |
|---|---|---|---|
| | 870Hv | 980Hv | 1100Hv |
| | SAMPLE 1 | SAMPLE 2 | SAMPLE 3 |
| LESS THAN 0.3 μm | 0 SHEETS | 16 SHEETS | 52 SHEETS |
| NOT LESS THAN 0.3 μm AND LESS THAN 0.5 μm | 11 SHEETS | 21 SHEETS | 28 SHEETS |
| NOT LESS THAN 0.5 μm AND LESS THAN 1 μm | 18 SHEETS | 43 SHEETS | 12 SHEETS |
| NOT LESS THAN 1 μm | 71 SHEETS | 20 SHEETS | 8 SHEETS |

METHOD FOR MANUFACTURING MASK BLANK, METHOD FOR MANUFACTURING TRANSFER MASK, SPUTTERING TARGET FOR MANUFACTURING MASK BLANK

TECHNICAL FIELD

The present invention provides a method for manufacturing a mask blank having a thin film for forming a mask pattern on a substrate, a method for manufacturing a transfer mask manufactured by patterning the thin film of the mask blank, and a sputtering target used for manufacturing the mask blank.

BACKGROUND ART

Photolithography, which is a key manufacturing means of a semiconductor device or the like, has two required vital characteristics such as an increase in resolution and a securement of depth of focus, which are in relation against to each other. For example, it becomes obvious that a mere increase in a numerical aperture of a lens of an aligner and a mere reduction of a wavelength of an exposure light alone cannot improve practical resolution (monthly journal *SEMICONDUCTOR WORLD* 1990.12, *OYO BUTURI* (*APPLIED PHYSICS*), Vol. 60, No. 11 (1991), or the like).

Under these circumstances, phase shift lithography has been drawing attention as technology of the photolithography for a next generation. The phase shift lithography is a method for improving resolution of optical lithography by changing only a mask without changing an optical system, and a method for utilizing mutual interference of transmitting lights and significantly improving the resolution of the exposure lights by giving a phase difference between the exposure lights which transmit the mask (hereinafter, described as a phase shift mask) having a phase shift effect.

The phase shift mask is a mask simultaneously having light intensity information and phase information, and various types of the mask such as Levenson, auxiliary pattern, self-alignment (edge-enhancement), and the like are known. These phase shift masks have a more complicated structure and require higher level of technology with regard to manufacture than conventional photomasks having the light intensity information alone.

As one of the phase shift masks, a phase shift mask referred to as a so-called halftone phase shift mask has been recently developed. The halftone phase shift mask is provided with a semi-transmitting part simultaneously having two functions of shielding function to allow exposure light to be transmitted with intensity not substantially contributing to exposure, and a phase shift function to allow the phase of the light to be shifted (generally inverted). Therefore, a shielding film (referred to also as an opaque film in some cases) pattern and a phase shift pattern are not required to be separately formed, and a simple structure and easy manufacture are therefore achieved.

Here, a cross-sectional view of the halftone phase shift mask is shown in FIG. 3. In a halftone phase shift mask 5, a mask pattern is formed by a light transmitting part 2 and a light semi-transmitting part 3 on a transparent substrate 1. The light transmitting part functions to transmit the light of intensity substantially contributing to exposure, with the transparent substrate 1 exposed, and meanwhile the light semi-transmitting part functions to transmit the light of intensity not substantially contributing to exposure, having a light semi-transmitting film formed thereon to allow the phase of the transmitting light to be shifted. Furthermore, by a phase shift of the light that transmits the light semi-transmitting part 3, the phase of the light that transmits the light semi-transmitting part 3 and the phase of the light that transmits the light transmitting part 2 have a substantially inverted relationship. Then, lights passing near a boundary between the light semi-transmitting part 3 and the light transmitting part 2 and mutually detoured in the other's region by a diffraction phenomenon are canceled each other to set the light intensity to be approximately zero. The halftone phase shift mask is formed by improving contrast of the boundary, that is, the resolution of the boundary, by using the effect of setting the light intensity to be approximately zero.

Meanwhile, the light semi-transmitting part of the aforementioned halftone phase shift mask must have optimum values required for both of the light transmittance and phase shift amount. Furthermore, an inventor of the present invention previously filed an application relating to the phase shift mask capable of realizing the optimum values thus required by a single-layer light semi-transmitting part (U.S. Pat. No. 2,837,803, U.S. Pat. No. 2,966,369).

In the phase shift mask, the light semi-transmitting part is composed of a thin film made of metals such as molybdenum, tungsten, and the like, and silicon, oxygen and/or nitrogen as main components, which is a thin film made of molybdenum silicide, specifically, oxidized molybdenum and silicon (abbreviated as MoSiO), oxynitrided molybdenum and silicon (abbreviated as MoSiON), or nitrided molybdenum and silicon (abbreviated as MoSiN). These thin films are capable of controlling the transmittance by selecting an oxygen content or an oxygen and nitrogen content, and capable of controlling the phase shift amount by thickness of the thin film.

Not only in the phase shift mask but also in a general transfer mask, which means a transfer mask having a mask pattern on a substrate, the mask pattern is frequently made of a material containing silicon from a viewpoint of controllability of the shielding function of the mask pattern or workability of the mask pattern. In other words, in a mask blank as a member before patterning the transfer mask, a portion (a film) becoming the mask pattern is frequently formed by sputtering using a sputter target containing silicon. However, when the target containing silicon is used, there is a problem that many particles are generated during deposition. This is because that discharge is prone to be unstable during deposition using the target containing silicon. When the particles are generated during the deposition, mixture of the particles in the film occurs. When the particles come off from the film during cleaning or the like, a film thickness becomes thinner than an originally needed film thickness. For example, in the case of a shielding film, a shielding function cannot be exerted, depending on a degree of the film thickness becoming thin, resulting in a white defect, sometimes.

Furthermore, in the aforementioned halftone phase shift mask blank, a target containing a large silicon content is often used in order to control the transmittance of the light semi-transmitting part, thereby more remarkably posing the problem of generating particles when using the target containing silicon. Furthermore, when the particles are mixed in the light semi-transmitting film and come off from the film during cleaning or the like, the problem is more remarkably posed than the case of the aforementioned light shielding film. Specifically, in the case of the light semi-transmitting film, the phase shift amount or the transmittance changes according to a film thickness becoming thinner than the originally needed film thickness, thereby directly influencing the transfer characteristic. Therefore, if the generation of the particles when using the target containing silicon is reduced, this effectively works to reduce the defect of the phase shift mask.

When the phase shift mask blanks, which is a member before patterning, is provided having the light semi-transmitting part formed of the thin film as described above, the light semi-transmitting part formed of a single layer film of a single material can be obtained. According to the light semi-transmitting part thus formed, the deposition process can be more simplified and a single etching medium can be used, compared with a case of forming the light semi-transmitting part with a multi-layer film of different. materials. This contributes to simplifying a manufacturing process from the phase shift mask blank to the phase shift mask.

The thin film of MoSiO, MoSiON, or MoSiN is deposited by reactive sputtering in a gas atmosphere containing oxygen and/or nitrogen, using a target containing molybdenum and silicon. However, in accordance with micronization of the mask pattern, tolerance of a defect existing in the light semi-transmitting film of the phase shift mask blank has become extremely strict.

Furthermore, in the light semi-transmitting film, from a viewpoint of discharge stability during the deposition, from a viewpoint of advancement of the wavelength of the exposure light from KrF (248 nm) to ArF (193 nm), from a viewpoint of the transmittance of the light semi-transmitting film to be a high transmittance (9% to 20%), or the like, it has been difficult to control a phase difference and the transmittance by only controlling the oxygen and/or nitrogen content during the aforementioned reactive sputtering. Therefore, the phase difference and the transmittance are controlled by applying a target (hereinafter, described as silicon as a main component (silicon rich)) containing metals and silicon and containing a larger amount of silicon rather than stoichiometrically stable composition. Incidentally, the silicon as a main component in the present invention refers to silicon containing 70 atm % or more.

However, when the light semi-transmitting film is subjected to reactive sputtering to be deposited by using the aforementioned target composed mainly of silicon, a problem becomes obvious that a rate of generating defects caused by the particles in the light semi-transmitting film is increased by the particles generated during the deposition. The particles refer to fine particles having a diameter of, for example, 0.3 to 2 μm or more. When the particles are mixed in the light semi-transmitting film thus deposited, during a cleaning process conducted after the deposition, the particles come off from the light semi-transmitting film, and consequently, they become a pinhole or a half pin hole, as will be described later, or are remained in the light semi-transmitting film without being removed, resulting in a defect. The defect causes a generation of a lack of a pattern called a white defect during a manufacturing process of the phase shift mask by patterning the light semi-transmitting film.

Here, the pinhole is formed when the light semi-transmitting film is deposited, with the particles generated during deposition adhered on the substrate, and the particles thus adhered on the substrate come off from the light semi-transmitting film during the cleaning process, a recessed part is thereby generated on the surface of the light semi-transmitting film and the bottom of the recessed part reaches the substrate. Also, the half pin hole is formed when the particles are adhered on the substrate, with the deposition of the light semi-transmitting film on the substrate advanced to a certain extent, and the particles thus adhered on the substrate come off from the light semi-transmitting film during the cleaning process, the recessed part is generated on the surface of the light semi-transmitting film and the bottom of the recessed part does not reach the substrate.

As explained above, when the light semi-transmitting film is subjected to the reactive sputtering by using the target mainly composed of silicon, the problem specific to the target and the reactive sputtering is seemed to be the reason for causing the particles during deposition. Specifically, the target mainly composed of silicon to be used is not formed of a single compound, but is made in a mixed target formed of a simple substance (frequently including a silicon simple substance) and/or two or more of mixtures of a compound. The problem of uniformity in the composition or characteristics is involved in the mixed target, and therefore when the composition and characteristics are not uniform, discharge stability during the deposition cannot be obtained, causing the generation of the particles. Furthermore, during the reactive sputtering, oxygen and/or nitrogen is/are used in order to control the phase difference and the transmittance of the light semi-transmitting film. However, when using oxygen, the problem is that the discharge stability is reduced.

Furthermore, in the halftone phase shift mask, the phase shift mask and the phase shift mask blank described in Japanese Patent Laid-open No. Hei 7-128840 are known as an object of preventing leakage of the exposure light. FIG. 4 is a cross-sectional view of the phase shift mask described in Japanese Patent Laid-open No. Hei 7-128840. As shown in FIG. 4, the halftone phase shift mask described in this patent is formed by forming a semi-transmitting layer patterned by forming a transmitting part by removing a part of the film formed on the whole surface of the transparent substrate, and forming a light-shielding layer (referred to also as an opaque layer in some cases) on a main part excluding the vicinity of a boundary part between the semi-transmitting layer and the transmitting part. FIG. 5 is a halftone phase shift mask blank for manufacturing the halftone phase shift mask in FIG. 4.

When a shielding film (a shielding layer) is formed with the particles being mixed in the light semi-transmitting film (a translucent layer) during the formation of the halftone phase shift mask blank in FIG. 5, the white defect is generated in the light semi-transmitting film as described above when the particles come off during cleaning process after deposition, the particles come off involving the light shielding layer of an upper layer when coming off, and in some instances, the particles come off involving the light shielding layer in the peripheries of the particles, thereby involving the problem that the light shielding layer is excessively pealed. When the shielding layer is thus excessively peeled, the leakage of the exposure light cannot be prevented, causing transfer failure when transferred to a base to be transferred.

Furthermore, with the advancement of transfer accuracy, an attempt is made to set the transmittance of the light semi-transmitting part of the half tone phase shift mask to be high (9% to 20%). When the particles are mixed in the light semi-transmitting film of the mask, the problem is that even a minute defect of such extent that causes no problem in a normal mask becomes a defect. When the particles mixed in the light semi-transmitting part come off during the cleaning process, the problem is that the transmittance of a defect part is diminished only to contribute to exposure. Furthermore, in such a mask, the light semi-transmitting part exhibits a high transmittance, thereby necessitating the light shielding layer provided thereon as shown in FIG. 4, and as described above, the problem caused by the excessive peeling of the light shielding layer is thereby generated.

The present invention is provided in consideration of the aforementioned problems, and an object of the present invention is to provide a method for manufacturing the high quality phase shift mask blank capable of manufacturing with a high yield with a rate of generating defects in the light semi-transmitting film set to be less than or equal to a desired value, a method for manufacturing the phase shift mask manufactured by patterning the light semi-transmitting film of the phase shift mask blank, and the sputtering target for manufacturing the phase shift mask blank.

DISCLOSURE OF THE INVENTION

The present invention is provided in order to achieve the aforementioned objects, and can take several aspects as follows.

In a first aspect, a manufacturing method of a mask blank having a thin film for forming a mask pattern on a substrate is provided, wherein the thin film is formed by a sputtering method using a sputtering target containing silicon, and the sputtering target has a hardness of 900 HV or more in Vickers' hardness.

The target containing silicon includes a target composed of silicon and a small amount of multicomponents. Since the target containing silicon has low discharge stability, a problem is involved therein such that particles are generated during deposition and the particles are mixed in the thin film, resulting in a defect. However, a defect generation can be significantly reduced by setting the hardness of the target to be 900 HV or more in Vickers' hardness. Furthermore, in order to further effectively suppressing the defect generation, it is preferable that the hardness of the target is set to be 980 HV or more, more preferably set to be 1100 HV or more in Vickers' hardness. Thus, even in a reactive sputtering using a gas with low discharge stability, the generation of defects can be suppressed.

Furthermore, by setting the hardness of the target to be 1100 HV or more in Vickers' hardness, the rate of generation of the defects present on the light semi-transmitting film can be further effectively suppressed.

It should be noted that the Vickers' hardness of the present invention is measured by a hardness test method regulated by JIS Z 2244 and ISO 6507, which is an international standard corresponding thereto, and measured by setting a test load to be 9.807N.

In a second aspect, the manufacturing method of the mask blank according to the first aspect is provided, wherein the sputtering target has a hardness of 980 HV or more in Vickers' hardness.

As described above, by setting the hardness of the target to be 900 HV or more in Vickers' hardness, the defect generation can be significantly reduced. In addition, in order to further effectively suppress the defect generation, the hardness of the target is preferably set to be 980 HV or more, more preferably set to be 1100 HV or more in Vickers' hardness.

In a third aspect, the manufacturing method of the mask blank according to the first or second aspect is provided, wherein the thin film is formed by the reactive sputtering in an atmosphere containing oxygen and/or nitrogen.

It becomes possible to easily control the characteristics of the thin film such as a transmittance and a phase difference, or the like by the reactive sputtering in the atmosphere containing the oxygen and/or the nitrogen. Furthermore, conventionally, a problem is involved in the reactive sputtering containing oxygen, such that the particles are mixed in the thin film caused by low discharge stability. However, by the third aspect, it becomes possible to suppress the defect generation.

In a fourth aspect, the manufacturing method of the mask blank according to any one of the first to third aspects is provided, wherein the sputtering target contains silicon of 70 to 95 atm %.

There are often cases that the thin film is hard to have desired characteristics (a transmittance or the like) when a silicon content is less than 70 atm %, and that the thin film is hard to have discharge stability when the silicon content is 95 atm % or more.

In a fifth aspect, the manufacturing method of the mask blank according to any one of the first to fourth aspects is provided, the thin film is a light semi-transmitting film and the mask blank is a phase shift mask blank.

Even a defect (defect caused by a half pin hole of such extent capable of maintaining the light-shielding function, and caused by a micro pin hole and so forth) that causes no problem in the light-shielding film may cause fluctuation of the phase difference or the transmittance due to the defect generated in the light semi-transmitting film of the phase shift mask blank, and the problem involved therein is that the phase shift mask blank becomes imperfect. Furthermore, in an attempt to raise the transmittance of the light semi-transmitting part to high transmittance (9% to 20%) in the tendency of high transfer accuracy, problems involved therein are that, as described above, defect detecting accuracy in the light semi-transmitting film is further strictly requested and the defects are generated in the light-shielding film, which is an essential element of the mask blank, formed on the light semi-transmitting film.

By setting the hardness of the target to be 980 HV or more in Vickers' hardness, the rate of the generation of the defect with a size of 1 μm or more existing in the light semi-transmitting film is controlled to a desired value or less.

Furthermore, by setting the hardness of the target to be 1100 HV or more in Vickers' hardness, the rate of the generation of the defect with a size of 1 μm or more existing in the light semi-transmitting film is controlled to a desired value or less.

By the fifth aspect, mixing of the particles in the light semi-transmitting film can be effectively suppressed, and generation of the defect can be effectively suppressed.

In a sixth aspect, the manufacturing method of the mask blank according to any one of the first to fifth aspects is provided, wherein a metal film is formed on the thin film.

In the sixth aspect, when the particles are mixed in the thin film, the problem involved therein is that the metal film formed thereon is excessively pealed when the particles come off from the light semi-transmitting film. However, the present invention is capable of reducing the particles, and the above problem can therefore be diminished. Furthermore, by selecting the metal film formed of the materials different in etching characteristic in an etching condition for forming the mask pattern from the thin film, the thin film can be patterned with high accuracy. Further, preferably the metal film is selected from the material and thickness having the light shielding function so as to prevent leakage of an exposure light, to make the metal film serve as both as a mask material and a light-shielding material.

In a seventh aspect, the manufacturing method of the transfer mask is provided, wherein the transfer mask is manufactured by patterning the thin film of the mask blank manufactured by the manufacturing method of the mask blank according to any one of the first to sixth aspects.

When the transfer mask is manufactured by the mask blank, the transfer mask with fewer defects can be manufactured. Therefore, a process of correcting the defects and so forth can be significantly shortened to realize a shortened manufacturing process for manufacturing the transfer mask.

There are examples of the transfer mask such as a mask having a shielding pattern on a transparent substrate, a halftone phase shift mask having a halftone phase shift pattern on the transparent substrate, a substrate engraving phase shift mask provided with a shielding film or a halftone film, and a mask for electron beams, and so forth. Further, a photomask for a KrF, an ArF, and an F2 excimer lasers, for EUV, for an X-ray, and so forth are given as examples, and the method of the present invention can be applied to each kind of the above masks.

In the tendency of a shorter wavelength of the exposure light from a KrF excimer laser (248 nm) to an ArF excimer laser (193 nm) and an F2 excimer laser (157 nm), a sputtering target having a large silicon content has been used to meet the characteristics (transmittance and phase shift amount, etc) required for a film. When the silicon content is large, as described above, the problem is conspicuously posed such that the particles are generated during deposition. It is therefore preferable to select the hardness of the target according to the wavelength of the exposure light. Preferably, the target of 980 HV or more in Vickers' hardness is used for manufacturing the mask blank for KrF excimer laser, and the target of 1100 HV or more in Vickers' hardness is used for manufacturing the mask blank for ArF eximer laser.

It should be noted that the hardness of the target of the present invention is selected according to an exposure wavelength, various characteristics of the film, and a material of the target, or the like. However, it is preferable that the hardness of the target is 1400 HV or less in Vickers' hardness, and more preferably 1300 HV or less in order to obtain an effect of the present invention.

In an eighth aspect, a sputtering target mainly composed of silicon, for manufacturing a mask blank is provided, wherein the hardness of the target is 900 HV or more in Vickers' hardness.

The target mainly composed of silicon has a problem that particles are generated during deposition due to low discharge stability, and that the particles are mixed in the thin film, resulting in defects. However, the generation of the defects can be significantly reduced by setting the hardness of the target to be 900 HV or more in Vickers' hardness. Furthermore, it is preferable to set the hardness of the target to be 980 HV or more, and more preferably set to be 1100 HV or more in Vickers' hardness, for further effectively suppressing the generation of the defect. The generation of the defect can be thus suppressed even in the reactive sputtering using a gas with low discharge stability. This contributes to realizing the manufacture of the mask blank with significantly reduced defects.

In a ninth aspect, the sputtering target according to the eighth aspect is provided, wherein the sputtering target contains a metal silicide compound.

In the ninth aspect, as another manufacturing method of the target, the silicon powders and metal powders are sintered to generate metal silicide compound powders, then followed by sintering the metal silicide powders and the silicon powders to manufacture the target. In this case, preferably the metal silicide compound powders and the silicon powders are uniformly mixed and dispersed as much as possible. This contributes to improving the discharge stability, thereby suppressing the generation of the defects, as a result. Methods of forming the target of the hardness of 980 HV or more in Vickers' hardness include: uniformly mixing and dispersing the aforementioned powders; controlling pressure and heating temperature during a pressure sintering process in a powder sintering method to which a hot press (HP) method or a hot isostatic press (HIP) method is applied, or the like. In the tendency of the shortening wavelength of the exposure light from a KrF excimer laser to an ArF excimer laser, it is preferable to sinter the sputtering target used for manufacturing the mask blank with low defects by the hot isostatic press method.

There is a method of selecting the metal in the metal silicide compound, wherein the metal is selected for controlling the transmittance of the thin film. For example, Mo, Ta, W Ti, Cr, and the like are examples as the metal for controlling the transmittance of the thin film. A method for manufacturing the target by sintering a desired amount of silicon powders and the previously adjusted metal silicide powders is given as a method for allowing the above-described metal silicide compound to be contained in the target mainly composed of silicon.

In a tenth aspect, the sputtering target for manufacturing the mask blank according to either of the eighth or ninth aspect is provided, wherein the sputtering target contains the silicon of 70 to 95 atm %.

There are often such cases that desired characteristics (a transmittance or the like) cannot be obtained when a silicon content is less than 70 atm %, and that discharge stability cannot be obtained when the silicon content is more than 95 atm % or more.

In an eleventh aspect, a manufacturing method of a phase shift mask blank is provided, wherein by using a target containing metal and silicon, a light semi-transmitting film containing metal, silicon, oxygen and/or nitrogen is formed on a transparent substrate by sputtering in an atmosphere containing oxygen and/or nitrogen, wherein by using a correlation between hardness of the target and a rate of generating defects, the light semi-transmitting film is formed by using the target having a predetermined hardness, so as to set the rate of generating defects to be a desired value or less.

The target containing the metal and the silicon is manufactured by sintering metal powders and silicon powders. However, since there is the correlation between the hardness of the target and the rate of generating defects in the light semi-transmitting film, the rate of generating defects existing in the light semi-transmitting film can be suppressed to the desired value or less by the aforementioned sputtering, using the target having the sufficient hardness to suppress the rate of generating defects in the light semi-transmitting film to the desired value or less.

Furthermore, the hardness of the target containing larger amount of silicon than the target having stoichiometricallyt stable composition of the metal and the silicon is set to be a predetermined value or more. This realizes the phase shift mask blank, having a desired transmittance and phase difference in a predetermined light exposure wavelength, while suppressing the rate of generating defects in the light semi-transmitting film to be the desired value or less.

By setting the hardness of the target to be 980 HV or more in Vickers' hardness, the rate of generating defects of 1 μm or more existing in the light semi-transmitting film can be suppressed to the desired value or less.

Furthermore, by setting the hardness of the target to be 1100 HV or more in Vickers' hardness, the rate of generating defects of 1 μm or more existing in the light semi-transmitting film can be suppressed to be the desired value or less.

BRIEF DESCRIPTION OF DRAWINGS

FIG. 1 is a list of a hardness of a target and the number of defects of phase shift mask blanks relating to the present invention;

Figure 2:
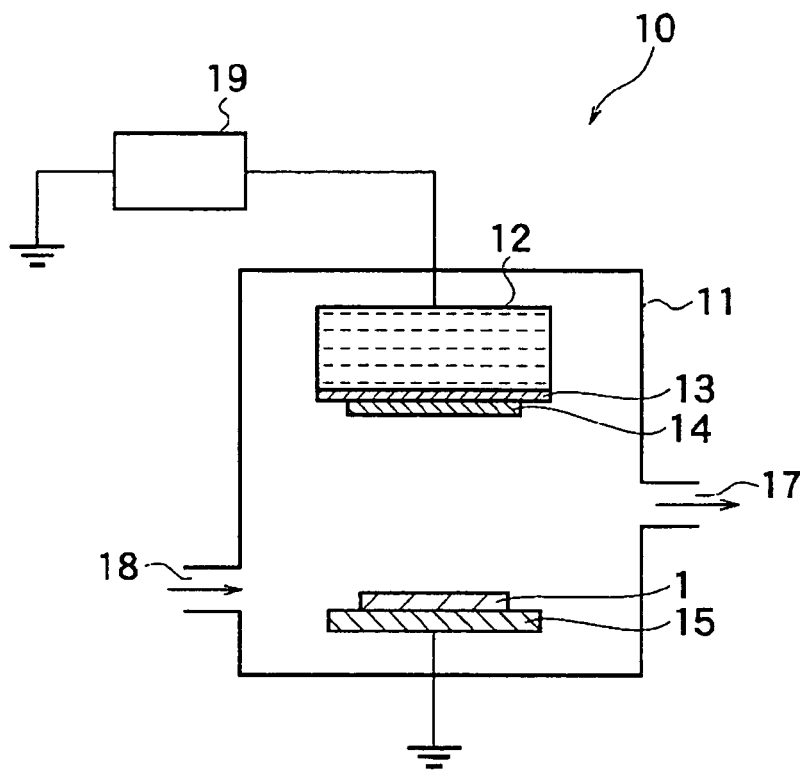
FIG. 2 is a cross-sectional schematic view of a DC magnetron sputtering device.
Figure 3:
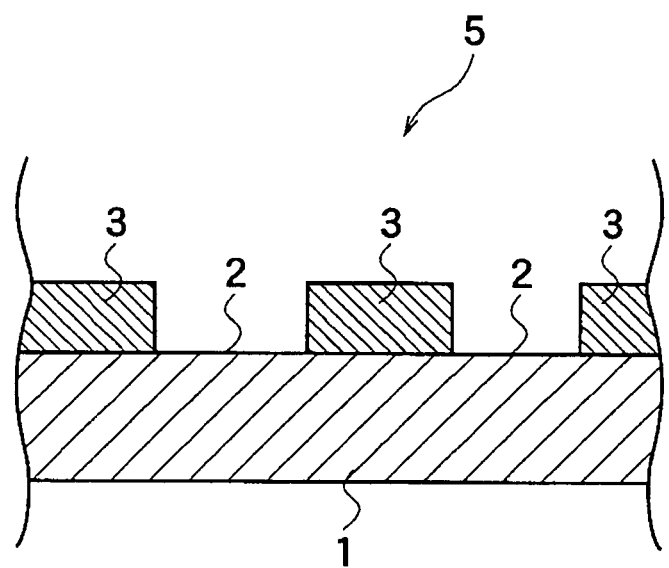
FIG. 3 is a cross-sectional schematic view of a halftone phase shift mask.
Figure 4:
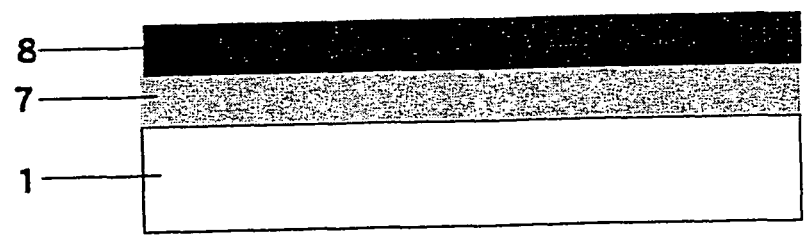
FIG. 4 is a cross-sectional schematic view of a halftone phase shift mask with a light shielding film.
Figure 5:
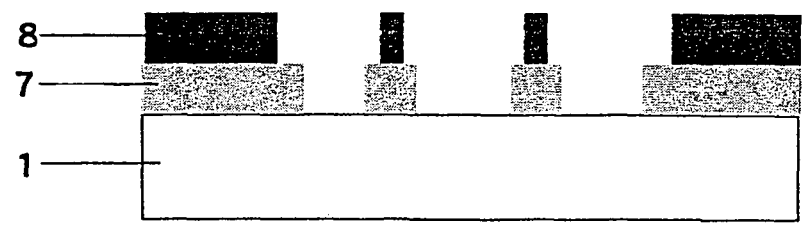
FIG. 5 is a cross-sectional schematic view of the halftone phase shift mask blank with the light shielding film.

EXPLANATIONS OF NUMERALS AND SYMBOLS 1 transparent substrate
2 light transmitting part
3 light semi-transmitting part
7 translucent layer
8 light shielding layer
10 sputtering device
11 vacuum tank
12 magnetron cathode
14 target
19 DC power supply

BEST MODE FOR CARRYING OUT THE INVENTION

Hereinafter, an embodiment of the present invention will be explained for each process of a target manufacturing process, a depositing process, a cleaning process, an evaluation of defects in a light semi-transmitting film, and a patterning process.

(Target Manufacturing Process)

One or more of metals selected from molybdenum, titanium, tantalum, tungsten, and chrome is/are preferably used for a metal contained in a target for sputtering relating to the present invention. Besides, preferably purity of the metal and silicon becoming raw materials of the target is set to be 5N or more, and impurities such as Fe, Ni, Cu, Al, or the like is suppressed to be several ppm or less, to raise reliability.

The target is mainly composed of silicon (silicon rich) in an amount larger than a stoichiometrically stable ratio. For example, when molybdenum is selected as a metal, the stoichiochemically stable ratio is molybdenum:silicon=33:67 (mol %). However, the amount of silicon to be contained in the target is preferably set to be 70 to 95 mol %, and more preferably 78 to 92 mol %.

The target having a predetermined hardness can be manufactured by, for example, a melting method to which electron beam (EB) melting or the like is applied, a powder sintering method to which a hot press (hereinafter, described as HP), a hot isostatic press (hereinafter, described as HIP), or the like is applied.

The powder sintering method using the HP or the HIP is preferable among the aforementioned methods for manufacturing the target from a viewpoint of controlling density, a particle size of silicon, a silicon content, and the like with high degree of freedom. Then, the target having a desired hardness can be obtained by controlling pressure and heating temperature in a pressure sintering process of the HP or the HIP. The hardness of the manufactured target can be measured appropriately by, for example, a Vickers' hardness tester or the like.

In this embodiment, first, molybdenum powders and silicon powders, which are raw materials of the target, are adjusted in a ratio of stoichiometrically stable composition, and a molybdenum silicide compound (Chemical Formula $MoSi_2$) was adjusted. Next, the amount of the molybdenum silicide powders and silicon powders thus obtained was adjusted, and the powders were pressure sintered by the HP or the HIP to manufacture the target mainly composed of silicon and having the hardness of 1100 HV. The hardness of the target can be controlled by controlling the pressure and the heating temperature of the pressure sintering. However, the heating temperature needs to be lower than the melting point of silicon (approximately 1414° C.), and preferably set to be 1300° C. or less, and more preferably set to be 1250° C. or less in order to reduce the generation of particles. The target is mainly composed of silicon, and mainly contains molybdenum silicide particles and silicon particles.

(Depositing Process)

The transparent substrate is not particularly limited, provided that it is a transparent material to the exposure wavelength to be used. However, synthetic quartz glass, fluorite, or other various glasses (for example, soda lime glass, aluminosilicate glass, aluminoborosilicate glass, or the like) are preferably used.

A process for depositing the light semi-transmitting film on the transparent substrate by sputtering by using the target having the aforementioned predetermined hardness will be explained with reference to the drawing.

FIG. 2 is a schematic cross-sectional view of a DC magnetron sputtering device (hereinafter, described as a sputtering device). A sputtering device 10 includes a vacuum tank 11 and a DC power supply 19, and the vacuum tank 11 is provided with a gas outlet 17 and a gas inlet 18, and furthermore, a magnetron cathode 12 and a substrate holder 15 are disposed opposite to each other in an interior of the vacuum tank 11. A target 14 for sputtering is mounted on the magnetron cathode 12 via a backing plate 13, and a transparent substrate 1 is fixed on the substrate holder 15. The vacuum tank 11 is evacuated by a vacuum pump not shown via the gas outlet 17. After an atmosphere in the vacuum tank 11 reaches a vacuum degree to an extent as not to influence the characteristics of the film to be formed, an atmosphere gas is introduced from the gas inlet 18, and negative voltage is applied to the magnetron cathode 12 using the DC power supply 19, followed by sputtering. The DC power supply 19 has an arc detecting function and capable of monitoring a discharge condition during sputtering. A pressure in the vacuum tank 11 is measured by a pressure gauge.

In this embodiment, oxygen free steel is used for the backing plate 13, and indium is used for adhesion of the aforementioned target 14 and the backing plate 13. The backing plate 13 is directly or indirectly cooled by a water cooling function not shown. The backing plate 13 and the target 14 are electrically coupled to the magnetron cathode 12.

An inert gas such as Ar, He and a mixed gas of the inert gas such as Ar, He and an oxygen gas and/or a nitrogen gas are used for the atmosphere gas during sputtering. NO gas, N2O gas or CO gas, CO2 gas in addition to O2 gas and N2 gas can be used for the oxygen gas and/or the nitrogen gas.

It should be noted, when 0 to 40% (preferably 0 to 20%) of oxygen and 0 to 90% (preferably 50 to 80%) of nitrogen are contained in the atmosphere gas during sputtering, that operation and effect of the present invention can be remarkably obtained. Furthermore, the sputtering with larger amount of nitrogen than the amount of oxygen is preferable, from the viewpoint of the discharge stability of the oxygen.

Contents of the metal, silicon, and oxygen and/or nitrogen in the light semi-transmitting film deposited on the transparent substrate 1 can be appropriately adjusted to obtain a desired light transmittance (1 to 20%) and a phase difference in an applicable exposure wavelength of the phase shift mask. to be manufactured. Furthermore, carbon, fluorine, helium, or the like in addition to oxygen and/or nitrogen may be preferably contained in the light semi-transmitting film from the viewpoint of reducing film stress of the light semi-transmitting film. In this case, CO gas, CO2 gas, CH4 gas, He gas, or the like may be added to the atmosphere gas during sputtering. The light semi-transmitting film deposited on the transparent substrate 1 can be thus obtained.

(Cleaning Process)

A method for cleaning the light semi-transmitting film deposited on the transparent substrate is not particularly limited. A cleaning method which is generally conducted under a cleaning process of the phase shift mask blank, for example, a cleaning method performed by dipping in a cleaning solution to which ultrasonic waves are impressed, a cleaning method using functional water such as hydrogenated water or the like, and a scrub cleaning method, and the like may be used. The phase shift mask blank is thus obtained.

(Evaluation of Defects in Light Semi-transmitting Film)

The light semi-transmitting film of the phase shift mask blank thus obtained is subjected to measurement of the number of defects (particles, pin holes including half pin holes) each having the size of less than 0.3 μm, 0.3 μm or more and less than 0.5 μm, 0.5 μm or more and less than 1 μm, and 1 μm or more, by an inspecting apparatus. As a result, it was found that a yield of the phase shift mask blank completely free of the defects of 1 μm or more (hereinafter, described as 1 μm defect free) was enhanced as the hardness of the target used for sputtering becomes higher. Also, it was found that the yield of the preferable phase shift mask blank completely free of the defects of 0.5 μm or more (hereinafter, described as 0.5 μm defect free) and also the yield of the more preferable phase shift mask blank completely free of the defects of 0.3 μm or more (hereinafter, described as 0.3 μm defect free) were enhanced as the hardness of the target becomes higher.

From the results mentioned above, it turned out to be possible that the rate of generating defects in the light semi-transmitting film could be suppressed to the desired value or less by setting the hardness of the target to be more than predetermined value. Although detailed mechanism to enable to suppress the rate of generating defects in the light semi-transmitting film to the desired value or less is yet unclear, it can be estimated as follows.

The defects (particles, pin holes including half pin holes) of the light semi-transmitting film seem to be mainly influenced by sintering property of the target.

As described above, the target containing the metal and silicon is manufactured by sintering metal powders and silicon powders (Specifically, manufactured by sintering metal silicide powders previously adjusted from metal powders and silicon powders, and silicon powders). However, the sintering property is generally required to be good. Specifically, it is considered that if the sintering property of the target is bad, particles (mainly metal silicide particles and silicon particles) constituting the target become a large lump, spring out of the target and adhere to the substrate, or a foreign matter included in the target springs out of the target and adheres to the substrate during sputtering, with the result that the particles and the foreign matter thus spring out are remained on the light semi-transmitting film to become particles, or by being removed from the light semi-transmitting film, the particles and the foreign matter thus spring out become the half pin holes and the pin holes.

As mentioned above, according to the present invention, by quantitatively grasping right and wrong of the sintering property of the target and managing the sintering property of the target, it was found that the rate of generating defects in the light semi-transmitting film could be suppressed to the desired value or less. However, it was difficult to quantitatively grasp the right and wrong of the sintering property. For example, the density of the target was taken into consideration as means to quantitatively grasp the right and wrong of the sintering property of the target. However, it was found that there was not necessarily the correlation between the density of the target and the rate of generating defects in the light semi-transmitting film.

Accordingly, the correlation between the defects of the light semi-transmitting film and various physical properties of the target was studied. Then, the hardness of the target in Vickers' hardness was found out as an indirect means to grasp the right and wrong of the sintering property of the target.

According to the present invention, the phase shift mask blank was manufactured by using a plurality of targets different in hardness, and the rate of generating defects in the light semi-transmitting film caused by the particles generated during sputtering was checked. Then, it was found that there was a correlation between the hardness of the target and the rate of generating defects in the light semi-transmitting film, such that the rate of generating defects in the light semi-transmitting film was reduced as the hardness of the target became harder. Then, based on this correlation, it was found that the rate of generating defects in the light semi-transmitting film could be suppressed to the desired value. or less by setting the hardness of the target to be the desired value or more. Particularly, the rate of generating relatively larger defects such as the defects of 1 μm or more was reduced, as the target became harder. Consequently, it was possible to manufacture the phase shift mask blank of high quality, with the rate of generating defects in the light semi-transmitting film being suppressed to the desired value or less with a high yield.

(Patterning Process)

A resist film was formed on the light semi-transmitting film of the phase shift mask blank and a resist pattern was formed by carrying out pattern exposure and development. Next, the pattern (such as holes and dots) of the light semi-transmitting film was obtained by dry etching using CF4+O2 gas as a single etching medium. The resist was peeled after formation of the pattern and washed with 98% sulfuric acid at 100° C. for 15 minutes by dipping thereinto for 15 minutes, and thereafter rinsed with pure water. Then, the phase shift masks of high quality could be manufactured with high yield, with the rate of generating the defects of the light semi-transmitting film suppressed to be the desired value or less.

Note that the present invention is not limited to the phase shift mask blank described in the embodiment. As a preferable example of the phase shift mask blank, as a first case, a metal film becoming a mask for patterning the light semi-transmitting film is formed on the light semi-transmitting film. As a second case, when manufacturing the phase shift mask, the metal film is formed on the light semi-transmitting film to serve as a light shielding film and an antireflection film. A material preferably used for the metal film thus formed includes the material having etching characteristic different from that of the light semi-transmitting film, for example, when the light semi-transmitting film is made of molybdenum-silicon based material, Cr-based material (such as Cr single element or Cr oxide, nitride and carbide) can be preferably used.

EXAMPLE 1

Hereinafter, a method for manufacturing the phase shift mask blank and the phase shift mask of the present invention will be further explained in detail.

First, molybdenum silicide powders (Chemical Formula $MoSi_2$) were adjusted by using molybdenum powders and silicon powders as raw materials so that a composition ratio of the target became Mo:Si=8:92 (mol %). Next, the molybdenum silicide powders thus obtained were mixed with silicon powders, which was then subjected to press sintering under appropriate pressure and heating temperature by the HP method, thus manufacturing three kinds of molybdenum silicide targets different in hardness, such as a molybdenum silicide target of 870 HV in Vickers' hardness (Sample 1), a molybdenum silicide target of 980 HV in Vickers' hardness (Sample 2), and a molybdenum silicide target of 1100HV in Vickers' hardness (Sample 3). Note that the hardness of the target was measured by using a Vickers' hardness tester and by a Vickers' hardness test method regulated by JIS Z 2244 and ISO 6507, which is an international standard corresponding to JIS Z 2244, setting the test load to be 9.807N. Five points on the surface of the polished target was measured and the averaged value of the five points was obtained as a measured value.

The aforementioned target and a quartz glass substrate as the transparent substrate was disposed in the aforementioned DC magnetron sputtering device. Then, an atmosphere in the device was set as a mixed gas atmosphere of argon (Ar) and nitrogen (N2) (Ar:N2=10%:90%, pressure:0.3 Pa), and by reactive sputtering, an MoSiN thin film having a film thickness of approximately 672 angstrom was formed on the transparent substrate as the light semi-transmitting film.

Next, the transparent substrate on which the MoSiN thin film was formed was scrub cleaned so that the surface of the thin film was cleaned, and the phase shift mask blank was manufactured. When measuring optical characteristics of the thin film thus obtained, it was found that the thin film had a transmittance of 5.5% and a phase difference of 180° in a wavelength (193 nm) of an ArF excimer laser, which were optimum optical characteristics as the light semi-transmitting film for the phase shift mask blank. Note that 100 sheets of the phase shift mask blank from the target (Sample 1), from the target (Sample 2), and from the target (Sample 3) were respectively manufactured.

All of the defects (particles, pinholes including half pin holes) of the MoSiN thin films of the phase shift mask blanks of Samples 1 to 3 thus manufactured were measured by a defect inspection apparatus (GM-1000 manufactured by Hitachi Electronics Engineering). Then, the defect inspection apparatus counted the number of sheets with 0.3 μm defect free, the number of sheets with 0.5 μm defect free, and the number of sheets with 1 μm defect free, in the phase shift mask blank of samples 1 to 3. Note that sizes of the particles were calculated based on generally known plural latex particles with different sizes as compared therewith, and the sizes of the pinholes were calculated based on the generally known masks having plural holes different in sizes as compared therewith. The result thus obtained is shown in a list of the hardness of the target and the number of defects of the phase shift mask blank in FIG. 1. FIG. 1 is a list in which the defects are classified by maximum sizes among defects detected from individual mask blank. For example, "less than 0.3 μm" means a mask blank with no defects of 0.3 μm or more (which means "0.3 μm defect free"). Also, "0.5 μm defect free" means a mask blank with no defects of 0.5 μm or more, and means a total number of "less than 0.3 μm" and "0.3 μm or more and less than 0.5 μm" in FIG. 1. Similarly, "1 μm defect free" means a mask blank with no defects of 1 μm or more and means a total number of "less than 0.3 μm", "0.3 μm or more and less than 0.5 μm", and "0.5 μm or more and less than 1 μm."

As obviously shown in FIG. 1, when the targets (Sample 1) were used, the number of the phase shift mask blanks of Sample 1 having a defect size of less than 0.3 μm is 0 (zero) sheet, the number thereof having the defect size of 0.3 μm or more and less than 0.5 μm was 11 sheets, and the number thereof having the defect size of 0.5 μm or more and less than 1 μm was 18 sheets; therefore, the number thereof having 1 μm defect free was 29 sheets out of 100 sheets (a yield of 1 μm defect free=29%) and a yield of 0.5 μm defect free=11%.

When the targets (Sample 2) were used, the number of the phase shift mask blanks of Sample 2 having the defect size of less than 0.3 μm was 16 sheets, the number thereof having the defect size of 0.3 μm or more and less than 0.5 μm was 21 sheets, and the number thereof having the defect size of 0.5 μm or more and less than 1 μm was 43 sheets; therefore, the number thereof having 1 μm defect free was 80 sheets out of 100 sheets (a yield of 1 μm defect free=80%) and a yield of 0.5 μm defect free=40%, and that of 0.3 μm defect free=16%.

When the targets (Sample 3) were used, the number of the phase shift mask blanks of Sample 3 having the defect size of less than 0.3 μm was 52 sheets, the number thereof having the defect size of 0.3 μm or more and less than 0.5 μm was 28 sheets, and the number thereof having the defect size of 0.5 μm or more and less than 1 μm was 12 sheets; therefore, the number thereof having 1 μm free was 92 sheets out of 100 sheets (a yield of 1 μm defect free=92%) and a yield of 0.5 μm defect free=80%, and that of 0.3 μm defect free=52%.

From these results, it was found that as the hardness of the target became high, the total number of sheets having 0.3 μm defect free, 0.5 μm defect free, and 1 μm defect free was increased, thereby increasing the yields of each size with the defect free, and further increasing the percentage of occupancy of the number of sheets with small defect size of 0.5 μm defect free and 0.3 μm defect free.

Specifically, when the light semi-transmitting film was deposited by using the target of 980 Hv or more in Vickers' hardness, the phase shift mask blank not having defects of 1 μm or more in the light semi-transmitting film could be manufactured with a yield of 80% or more, and the phase shift mask blank not having defects of 0.5 μm or more in the light semi-transmitting film could be manufactured with a yield of 40% or more.

Furthermore, when the light semi-transmitting film was deposited by using the target of 1100 Hv or more in Vickers' hardness, the phase shift mask blank not having defects of 1 μm or more in the light semi-transmitting film could be manufactured with a yield of 90% or more, and the phase shift mask blank not having defects of 0.5 μm or more in the light semi-transmitting film could be manufactured with a yield of 80% or more.

Here, in order to ensure the yield of the phase shift mask blank with 1 μm defect free, 1000 sheets of phase shift mask blanks were manufactured by using the target having the composition ratio of the target of this embodiment and having 1100 Hv in Vickers' hardness. Then, 934 sheets of 1 μm defect free phase shift mask blanks were obtained.

The phase shift mask blanks with aforementioned 1 μm defect free, etc, could be easily processed to the phase shift mask by the patterning process explained in the description of the preferred embodiments.

EXAMPLE 2

The light semi-transmitting film composed of MoSiN (having film thickness of approximately 672 angstrom) was formed on the transparent substrate in the same method as Example 1 by using the targets (Samples 1, 2, 3) used in Example 1, and thereafter, the film (having film thickness of approximately 600 angstrom) composed of Cr and CrO was continuously formed on the MoSiN film as a metal film. After thus forming the metal film, the surface of the metal film was scrub cleaned, and the phase shift mask blank was thereby manufactured. Note that the metal film thus obtained has a shielding function, and also the surface of the metal film has an anti-reflection function in the wavelength (193 nm) of the ArF excimer laser.

Next, the resist film was formed on the metal film of the phase shift mask blank, and by developing it, resist patterns were formed by pattern drawing.

Subsequently, metal film patterns were formed by wet etching with an etching solution composed of ceric ammonium nitrate, perchloric acid, and pure water, using the resist patterns as masks.

Next, MoSiN patterns were formed by the patterning process explained in the embodiment, using the metal film patterns as masks. Subsequently, a part of the metal films was removed and the phase shift mask was obtained.

Pattern defects were not found in the phase shift mask formed by using the targets of Samples 2 and 3. However, the particles were adhered on the phase shift mask formed by using the targets of Sample 1 during the deposition and pattern defects were checked, which were caused by excessive peeling of the metal film due to coming off of the particles during the cleaning process.

Incidentally, explanation has been given to molybdenum silicide as a target, as an example in the aforementioned examples. However, the target is not limited thereto, but may include one kind or more metals selected from titanium, tantalum, tungsten, and silicon.

INDUSTRIAL AVAILABILITY

In a method for manufacturing a mask blank having a thin film for forming a mask pattern on a substrate, by forming a thin film by sputtering using a target containing silicon and having hardness of 900 Hv or more in Vickers' hardness, mixing of particles into the thin film is suppressed, and as a result, it becomes possible to obtain a high quality mask blank capable of suppressing generation of defects.

The invention claimed is:

1. A method for manufacturing a phase shift mask blank, comprising:
   selecting a target having a predetermined hardness as the rate of generating defects becomes below a desired value, based on a correlation that the rate of generating defects in a light semi-transmitting film containing a metal, silicon, and at least one of oxygen and nitrogen becomes lower, the hardness of the target containing the metal and the silicon becomes higher, and
   performing sputtering using the target in an atmosphere containing at least one of oxygen and nitrogen, to form the light semi-transmitting film on a transparent substrate.

2. The method for manufacturing the phase shift mask blank according to claim 1, wherein the rate of generating defects is calculated based on a size of a defect.

3. The method for manufacturing the phase shift mask blank according to claim 1, wherein the rate of generating defects is calculated based on a size of a defect divided into a plurality of grades.

4. The method for manufacturing the phase shift mask blank according to claim 1, wherein the hardness of the target is 900 HV or more in Vickers' hardness.

5. The method for manufacturing the phase shift mask blank according to claim 1, wherein the hardness of the target is 980 HV or more in Vickers' hardness.

6. The method for manufacturing the phase shift mask blank according to claim 1, wherein the hardness of the target is 1100 HV or more in Vickers' hardness.

7. The method for manufacturing the phase shift mask blank according to claim 1, wherein the target contains 70 mol % to 95 mol % of silicon.

8. The method for manufacturing the phase shift mask blank according to claim 1, wherein the target contains more than 80 mol % to 95 mol % of silicon.

9. The method for manufacturing the phase shift mask blank according to claim 1, wherein the target contains one or more of metals selected from the group consisting of molybdenum, titanium, tantalum, tungsten, and chrome.

10. The method for manufacturing the phase shift mask blank according to claim 1, wherein the method further comprises sintering metal silicide powders and silicon powders to form the target.

11. The method for manufacturing the phase shift mask blank according to claim 10, wherein the sintering step is performed at a heating temperature of 1300° C. or less.

12. The method for manufacturing the phase shift mask blank according to claim 1, wherein the method further comprises cleaning the light semi-transmitting film after the light semi-transmitting film is formed.

13. The method for manufacturing the phase shift mask blank according to claim 1, wherein the light semi-transmitting film has a transmittance of 9% to 20% for an exposure wavelength.

14. A method for manufacturing a transfer mask by patterning the light semi-transmitting film of a mask blank manufactured by the method for manufacturing the phase shift mask blank according to claim 1.

* * * * *